(12) United States Patent
Mihira

(10) Patent No.: US 6,329,664 B1
(45) Date of Patent: Dec. 11, 2001

(54) ION IMPLANTATION APPARATUS FOR WAFERS

(75) Inventor: Jun Mihira, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/277,926

(22) Filed: Mar. 29, 1999

(30) Foreign Application Priority Data

Apr. 15, 1998 (JP) .................................................. 10-105177

(51) Int. Cl.$^7$ ...................................................... G21K 5/10
(52) U.S. Cl. ................................ 250/492.21; 250/442.11; 250/492.2; 250/492.3
(58) Field of Search ........................ 250/492.21, 442.11, 250/492.2–492.3

(56) References Cited

U.S. PATENT DOCUMENTS

| | | |
|---|---|---|
| 4,508,056 | 4/1985 | Bruel et al. . |
| 4,733,087 * | 3/1988 | Narita et al. . |
| 4,733,091 * | 3/1988 | Robinson et al. . |
| 4,745,287 * | 5/1988 | Turner . |
| 4,899,059 * | 2/1990 | Freytsis et al. . |
| 5,124,557 * | 6/1992 | Aitken . |
| 5,326,980 * | 7/1994 | Tajima et al. . |
| 5,525,807 * | 6/1996 | Hirokawa et al. . |
| 5,641,969 * | 6/1997 | Cooke et al. . |
| 5,753,923 * | 5/1998 | Mera et al. . |
| 5,864,143 * | 1/1999 | Ueda et al. . |
| 6,037,599 * | 3/2000 | Takase et al. . |
| 6,043,499 * | 3/2000 | Seki et al. . |

* cited by examiner

Primary Examiner—Teresa M. Arroyo
Assistant Examiner—Sharon Payne

(57) ABSTRACT

An ion implantation apparatus is provided which does not require dummy wafers and which is capable of reducing the manufacturing cost and increasing the throughput. The ion implantation apparatus is provided with holder arms connected to respective wafer holders on the wafer disc, and those holder arms make it possible to move the wafer holders in the radial direction of the wafer disc. The ion implantation apparatus is also provided with a control unit which controls the scanning position such that wafers are irradiated by the ion beam.

4 Claims, 11 Drawing Sheets

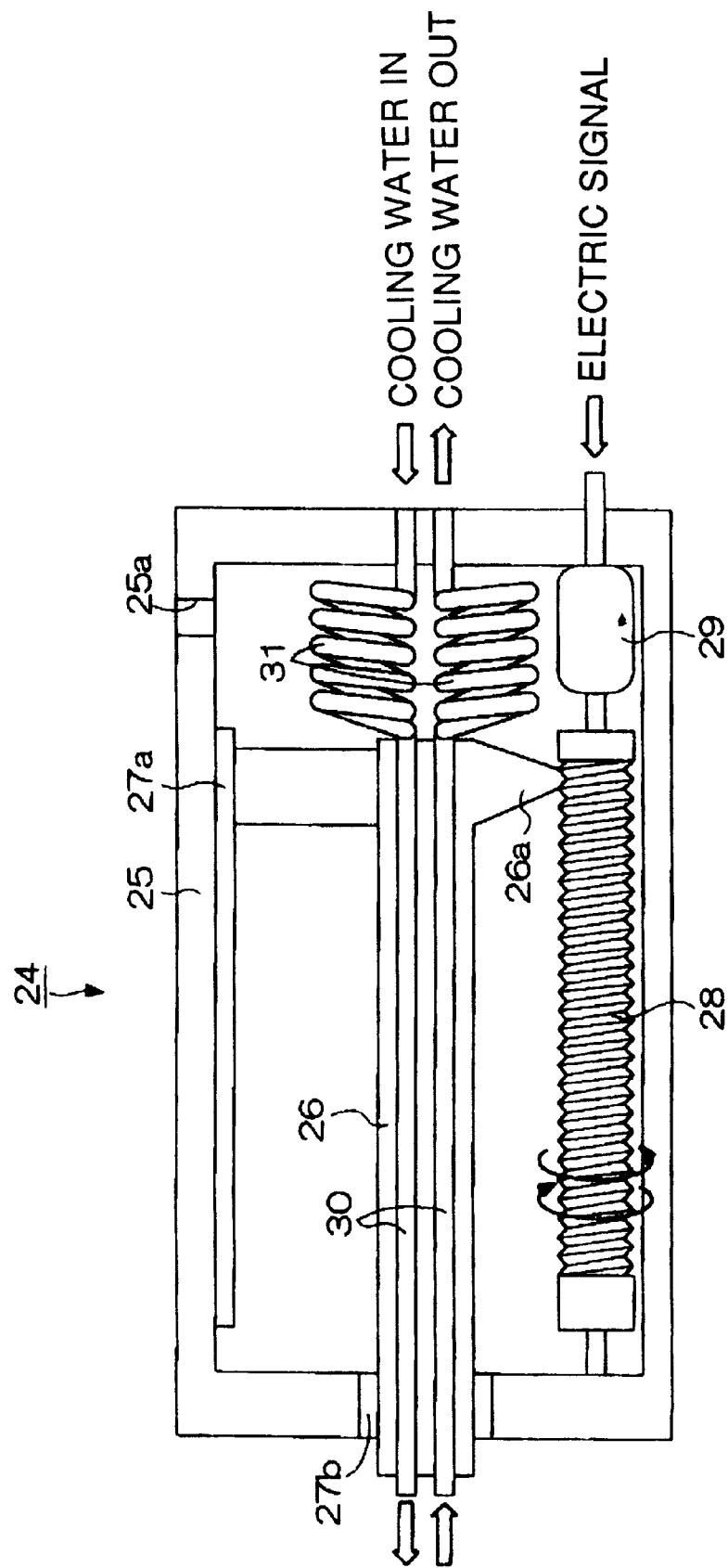

ION IMPLANTATION APPARATUS FOR WAFERS

BACKGROUND OF THE INVENTION

1. Field of the Invention

This invention relates to an apparatus for ion implantation, and particularly relates to a structure of a wafer disc for holding wafers provided in the apparatus for executing ion implantation on wafers using a batch type production system for producing semiconductor devices.

2. Background Art

In a batch type ion implantation treatment apparatus, ion implantation is carried out for a plurality of wafers supported by a wafer disc with a large diameter. In general, the wafer disc comprises a plurality of wafer holders arranged around its periphery, and each wafer is supported and fixed in each wafer holder by a fixing means such as a clamp. In a practical ion implantation operation, the wafer disc is driven to rotate and to move in reciprocating motions about an ion beam incident perpendicularly on wafer surfaces such that a plurality of wafers on the wafer disc are subjected to homogeneous ion implantation.

However, the following problems are encountered in conventional batch-type ion implantation apparatuses.

This batch-type ion implantation apparatus comprises a fixed number of wafer holders, that is, the number of wafers which can be treated as one batch is fixed. However, in practical ion implantation operations, the number of wafers to be treated is not always the same as the number of wafer holders, and sometimes the number of wafers is less than the number of fixed wafer holders. In this case, since the ion beam scans the whole surface area of the wafer disc, it is necessary to cover vacant wafer holders by, for example, dummy wafers. The use of dummy wafers raises the cost per wafer, and causes inflation of the manufacturing cost of the wafers.

In addition, even though the number of wafers is less than the number of wafer holders, ion irradiates the whole peripheral surface area of the wafer disc including wafer holders, so that a problem arises that the ratio of the area of the product wafers to the total area of ion irradiation is low, which results in causing a low through-put.

Furthermore, even if it is desired to change the ion dose for wafers in one batch, the only way to do this in conventional ion implantation apparatuses is to provide wafers with different ion doses in different batches.

It is therefore an object of the present invention to solve the above described problems and to provide an apparatus for ion implantation which is capable of executing ion implantation without using dummy wafers even when the number of untreated wafers is less than the number of one full batch such that the manufacturing cost can be reduced and the through-put is improved, and also to provide an ion implantation apparatus which is capable of producing wafers with different ion doses in the same batch.

SUMMARY OF THE INVENTION

In order to attain the above object, an ion implantation apparatus is provided which has a wafer disc having a plurality of wafer holders to support a plurality of wafers, and which carries out ion implantation for each wafer, while said wafer disc is rotating and while said wafer disc is shifting back and forth by a reciprocating motion perpendicular to the ion beam such that the wafers on the wafer holders are irradiated by the ion beam, wherein said plurality of wafer holders are designed such that they can move in the radial direction of the wafer disc by holder arms of the wafer holders, and wherein said apparatus comprises a control means for controlling the center of the shifting position of the reciprocating motion in the radial direction of the wafer disc such that said plurality of wafers supported on said wafer holders are irradiated by the ion beam.

According to another aspect of the present invention, the ion implantation apparatus of the above aspect further comprises holder arms connected to said plurality of wafer holders and the holder arms are designed so as to be extendable and contractable in the radial direction of the disc, and a driving means for driving so as to extend or to contract those holder arms automatically.

In the ion implantation apparatus of the present invention, a plurality of wafer holders can be moved in the radial direction of the wafer disc. Thus, it is possible to separate wafer holders into a group supporting the wafers and another group of vacant wafer holders at different positions. The control unit then controls the center position of the reciprocating motions of the wafer disc such that the region where the wafer holders supporting untreated wafers are irradiated by the ion beam. Accordingly, since the filled holders and vacant holders are separated geometrically, and the regions of vacant holders are not subjected to the ion beam, it is not necessary for this ion implantation apparatus to use dummy wafers which were required in conventional apparatuses.

Furthermore, when the number of wafers of a batch is small in comparison with the number of wafer holders, there was a problem in the conventional apparatus that the throughput was decreased due to the small area ratio of the product to the ion irradiation. In contrast, since it is necessary in the present ion implantation apparatus to carry out ion implantation in the restricted area in which holders supporting untreated wafers are positioned, the area ratio becomes larger than that of the conventional apparatus and the throughput is further improved.

According to another aspect of the present invention, the ion implantation apparatus according to the first aspect further comprises a center of gravity adjusting means for adjusting the center of gravity of the disc so as to coincide with the position of the disc center.

In the ion implantation apparatus according to the first aspect of the present invention, when said control means recognizes that a plurality of ion doses are required for untreated wafers in a batch, and the number of untreated wafers is less than the number of wafer holders, said control means forms a plurality of concentric circular regions corresponding to the number of ion doses by shifting the positions of the wafer holders, and ion implantation is executed by changing the speed of the reciprocating motions of the wafer disc using the intermediate range as the transition region of the speed change.

According to this constitution, wafers to be treated with the same ion dose are arranged in the same circular region on the wafer disc, and wafers in a batch are separate in separated concentric circular regions. By setting the optimum scanning speed for each region, and if it is possible to change the scanning speed for each region smoothly, untreated wafers in the same batch can be treated with different ion doses, which results in improving the working efficiency of the ion implantation.

BRIEF DESCRIPTION OF DRAWINGS

FIG. 11 is a cross sectional view showing another structural example of the holder arm in the ion implantation apparatus of the present invention.

DETAILED DESCRIPTION OF PREFERRED EMBODIMENTS

Hereinafter, preferred embodiments of this invention will be described in detail with reference to the attached drawings.

Figure 1:
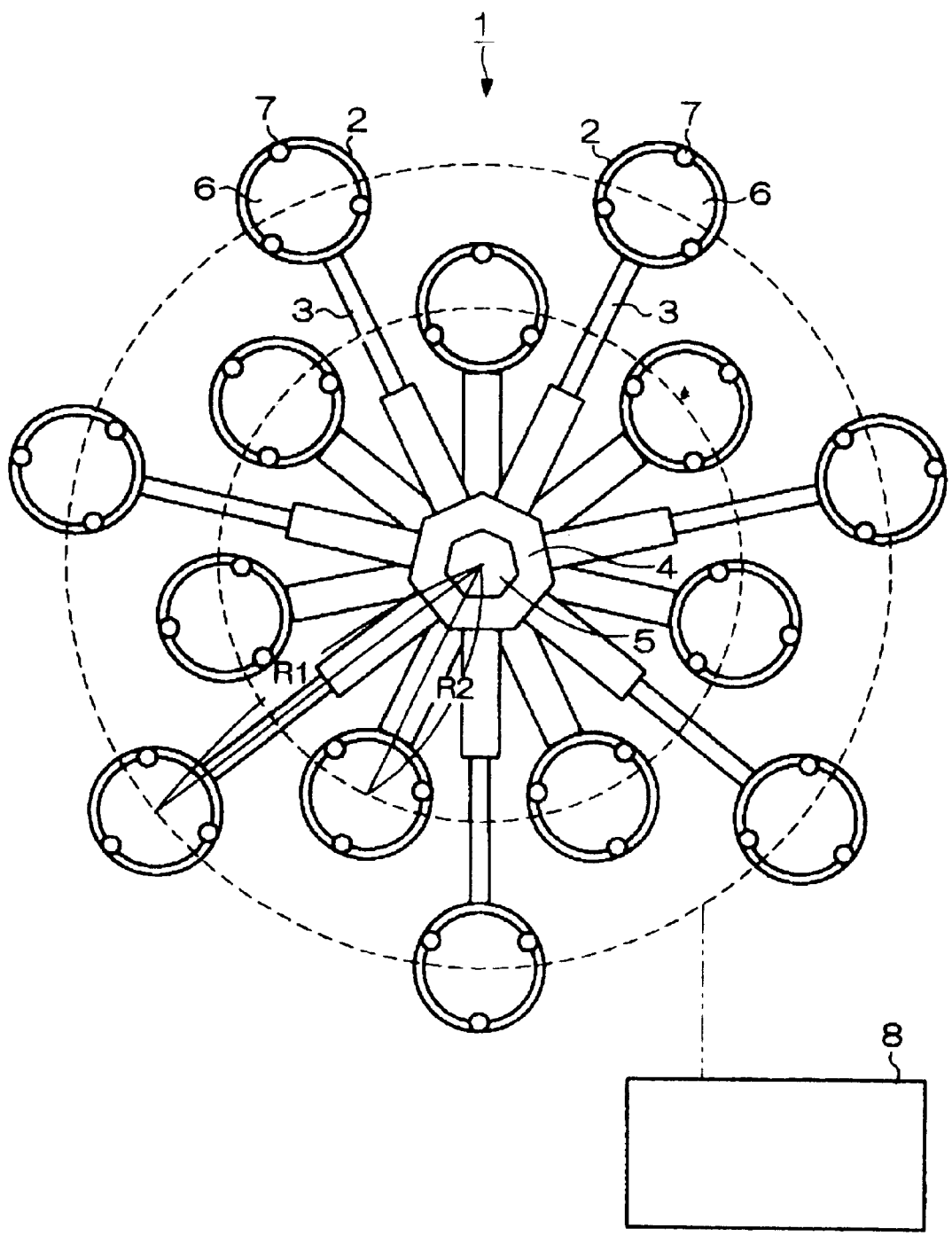
FIG. 1 is a plan view showing the structure of a wafer disc of an ion implantation apparatus according to one embodiment of the present invention.

FIG. 1 is a plan view showing the wafer disc of an ion implantation apparatus according to one embodiment of the present invention.

As shown in FIG. 1, the wafer disc 1 in the ion implantation apparatus according to one embodiment of the present invention is provided with a plurality of wafer holders 2 for supporting wafers; holder arms 3, one ends of which is connected to wafer holders 2 and the length of which is capable of expanding or contracting in the radial direction of the wafer disc 1; a center portion 4 to which the other end of the holder arms are connected and to which the rotational axis of the wafer disc is connected; and a center of gravity adjusting unit 5 (a center of gravity adjusting means) for adjusting the position of the center of gravity of the disc installed inside of the center portion 4 in the ion implantation apparatus to the position of the center of the disc. On the surface of each wafer support, a sheet 6 is adhered so as to improve adherence and cooling of the wafer, and the wafer support is designed such that the wafer is fixed in the wafer support 2 by means of three clamps 7 provided at three positions of the periphery of the supporting portion 2. The ion implantation of the present invention is provided with a control unit (a control means) for controlling the holder arm lengths and scanning positions of the ion beam depending upon the number of untreated wafers and the working conditions. In addition, a conveying mechanism (not shown) is provided in the present apparatus to transport untreated wafers automatically from, for example, cassettes etc. into the wafer disc.

Figure 2:
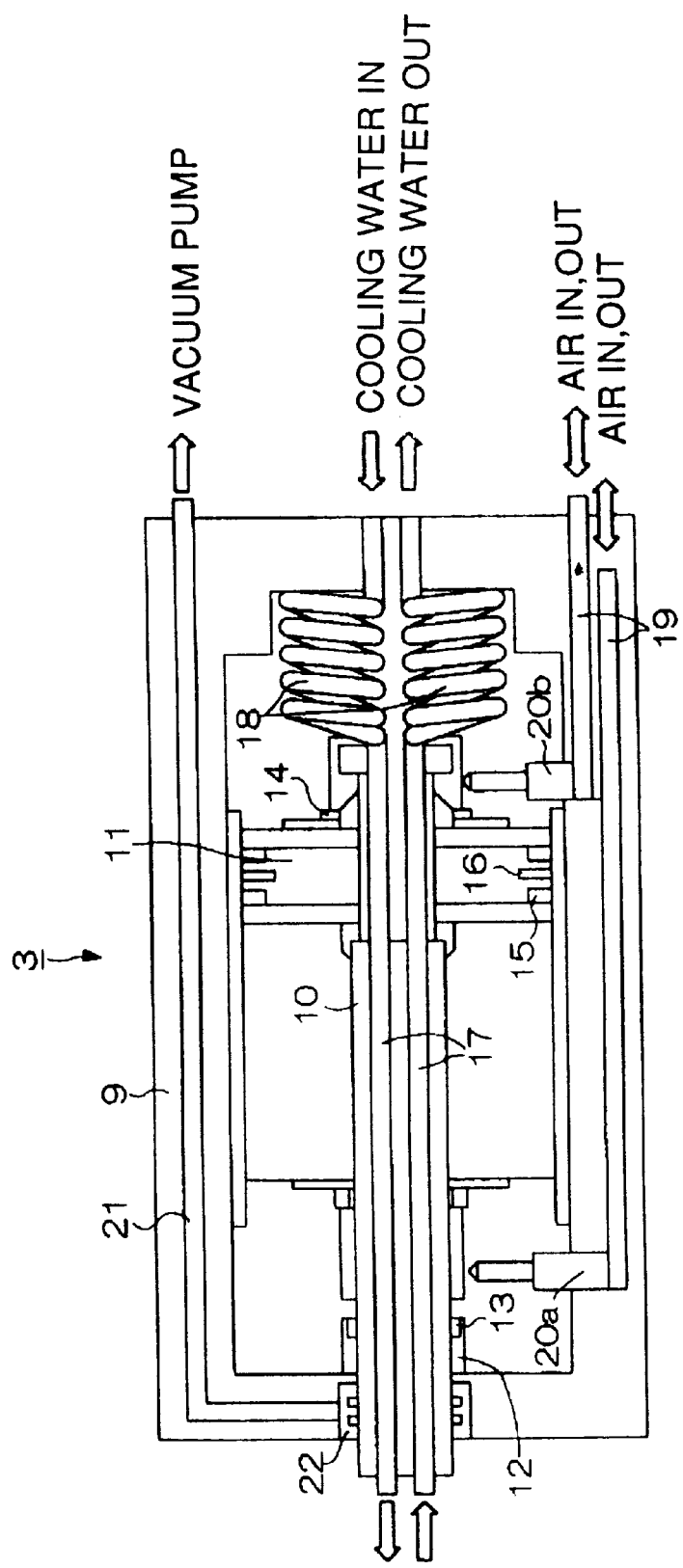
FIG. 2 shows the structure of an holder arm of the ion implantation apparatus.

FIG. 2 illustrates a cross sectional view of the holder arm 3. The holder arm 3 according to one embodiment of the present invention is driven by the air-cylinder structure. The air-cylinder portion comprises a piston rod 10, a piston 11, an oil bushing 12, a rod packing 13, a cushion packing 14, a piston packing 15, and a magnet 16. There is provided a piping 17 in the piston rod 10 for cooling the wafer support 2 at the top end of the holder arm 3 and a cooling tube 18 is connected to one end of the piping 17. Furthermore, an air piping 19, needles 20a and 20b are provided in the cylinder tube for driving the piston 11, and a vacuum piping 21 and a vacuum seal 22 are further provided.

The movement of the holder arm will be described. The holder arm contracts by movement of the piston in the right direction of FIG. 2, when air is supplied into the needle 20a, and the holder arm elongates by movement of the piston in the left direction of FIG. 2 when air is supplied into the needle 20b. The switching of the air supply is performed through the air piping 19 built in the cylinder tube 9. A water cooling tube 18 is provided in the piston rod 10 for cooling the wafer support, and the cooling tube 18 is designed so as to be able to expand or contract for executing water cooling even when the holder arm expands. A vacuum seal 22 for sealing the inside of the air cylinder from the outside vacuum region when the piston rod is driven is provided at the top end of the cylinder tube 9, and it is designed such that the vacuum seal 22 is evacuated by a vacuum pump (not shown) through the vacuum piping 21.

Operations of the wafer disc will be described hereinafter for different numbers of wafers.

Figure 3:
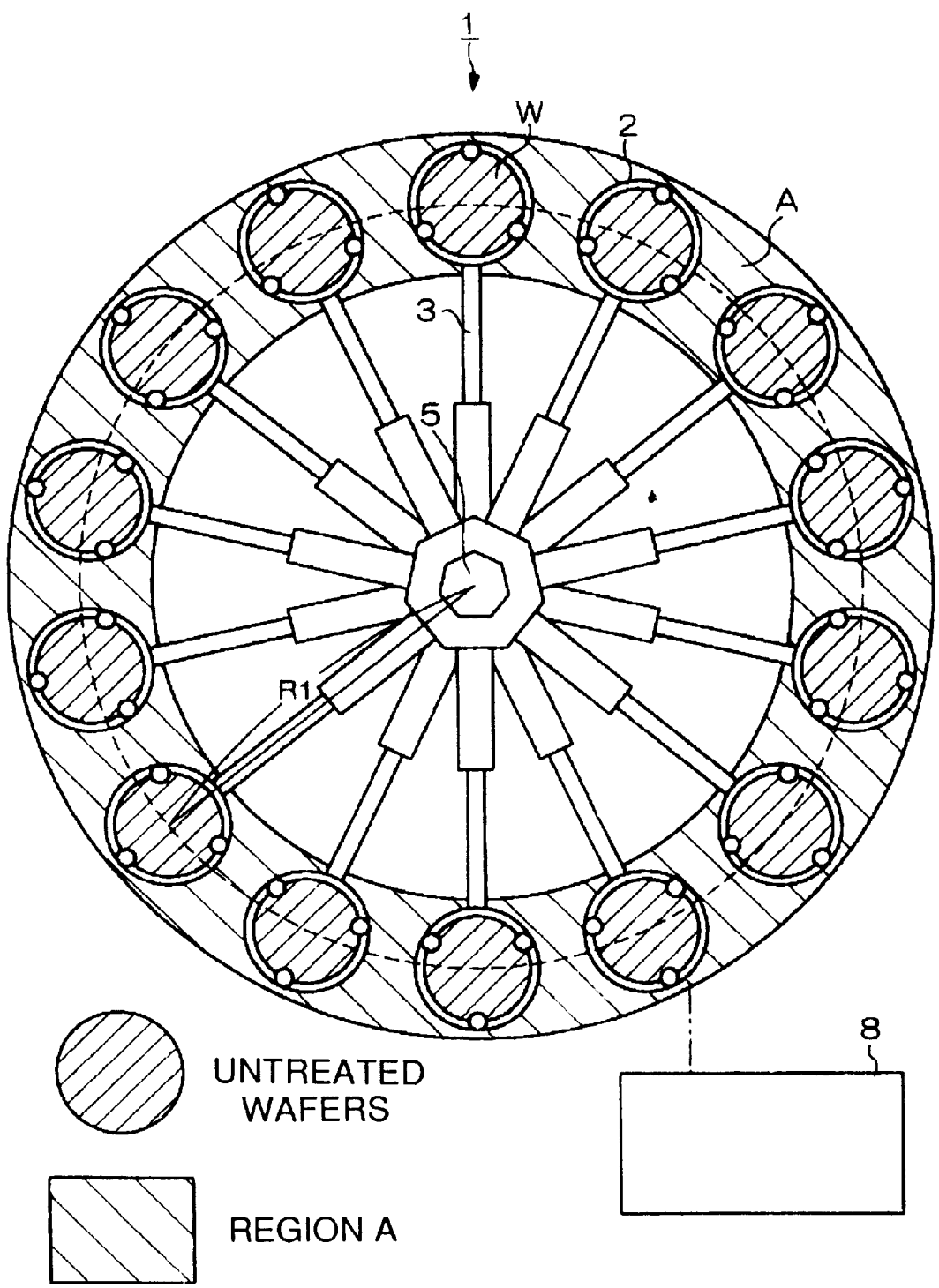
FIG. 3 is a diagram to explain the movements of the wafer disc in the apparatus, when the number of untreated wafers coincides with the number of wafer holders.

(1) The Case When the Ion Dose is the Same for Every Wafer and the Number of Wafers Coincides With the Number of Wafer Holders of the Wafer Disc The explanation is given for the condition that the ion implantation is the same for every wafer and the number of untreated wafers is the same as the number of wafer holders, that is, ion implantation is executed for one batch of 14 wafers as shown in FIG. 3.

In the case when the control unit 8 recognizes that the condition of ion implantation is the same for every wafer and the number of untreated wafers W is the same as that of the wafer holders, ion implantation is implemented without adjusting the length of the holder arms 3 and the gravity center adjustment unit 5. At this time, a distance between the center of the wafer support and the center of the wafer disc is R1. The width of the reciprocating movement (the scanning width) is not altered and remains as original. Ion implantation is carried out in a region A.

Figure 4:
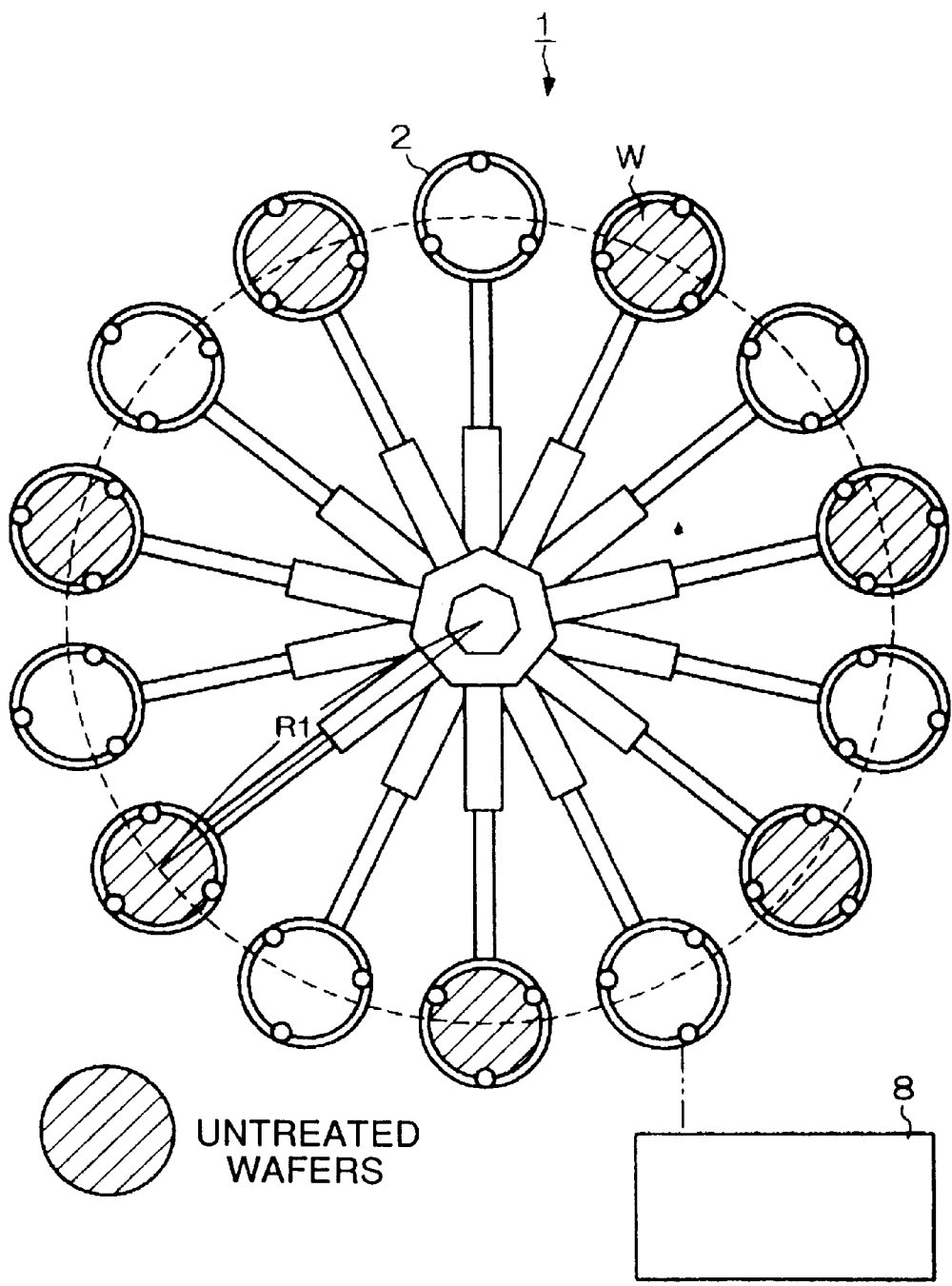
FIG. 4 is a diagram to explain the movements of the wafer disc in the apparatus, when the number of untreated wafers is half or less than half of the number of wafer holders.

(2) The Case When the Ion Dose is the Same for Every Wafer and the Number of Untreated Wafers is Less than Half of the Number of Wafer Holders of the Wafer Disc The case in which the condition of the ion implantation is the same for every wafer , and the number of untreated wafers W is less than half of that of the wafer holders 2, that is, the number of wafers of one batch is less than 7, is described hereinafter with reference to FIGS. 4, 5, and 6.

When the control unit 8 recognizes that the ion dose is the same for every wafers, and the number of untreated wafers is less than half (7 wafers in FIG. 4), untreated wafers W are conveyed and supported to the wafer holders, such that the center of gravity of the disc 1 does not change from the center of the disc 1. At this moment, the distance between the center of the wafer holders supporting each working wafer and the center of the disc remains as R1.

Figure 5:
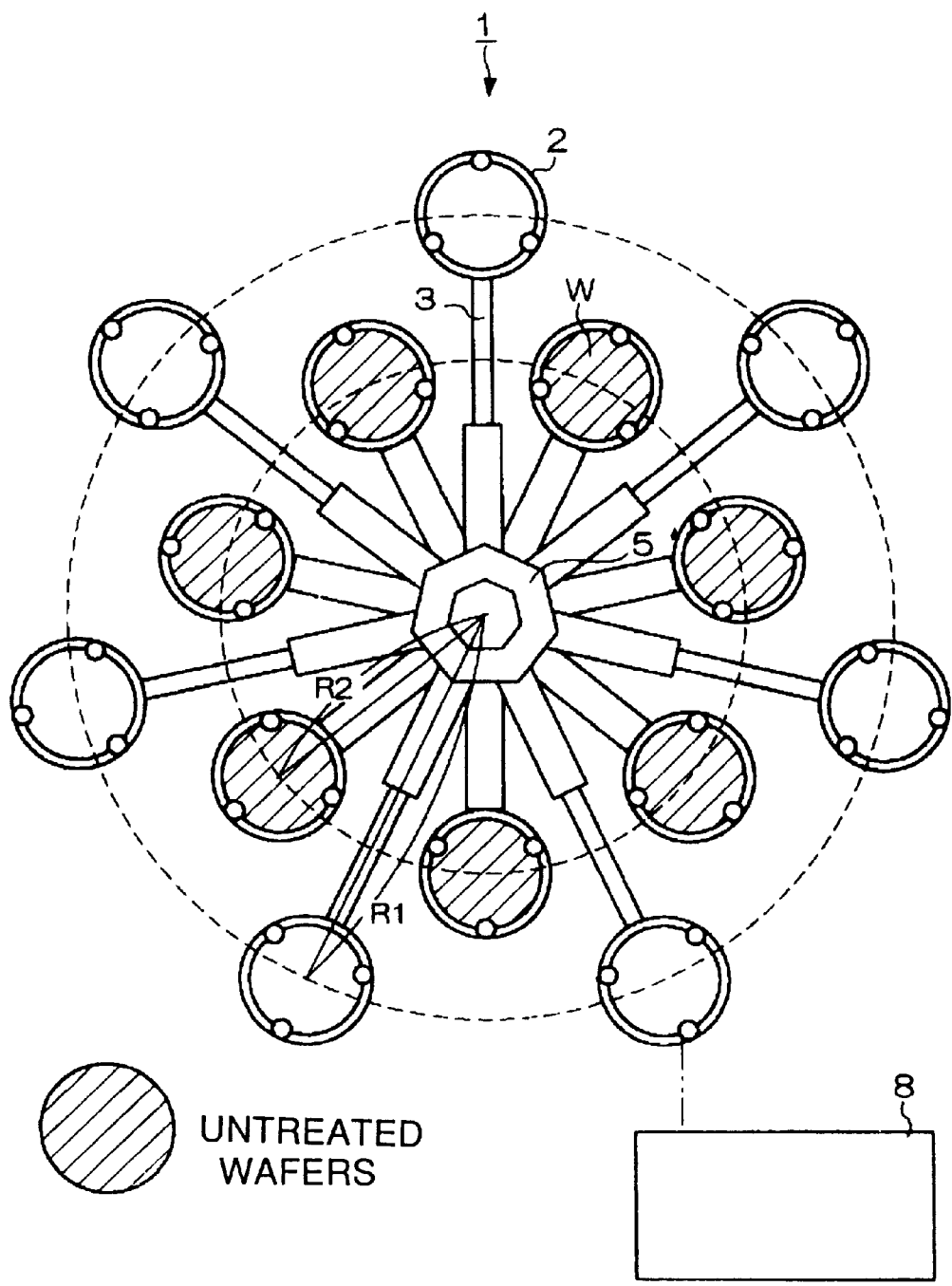
FIG. 5 is a diagram to explain the movements of the wafer disc, when the untreated wafers are the half of the number of the wafer holders.
Figure 6:
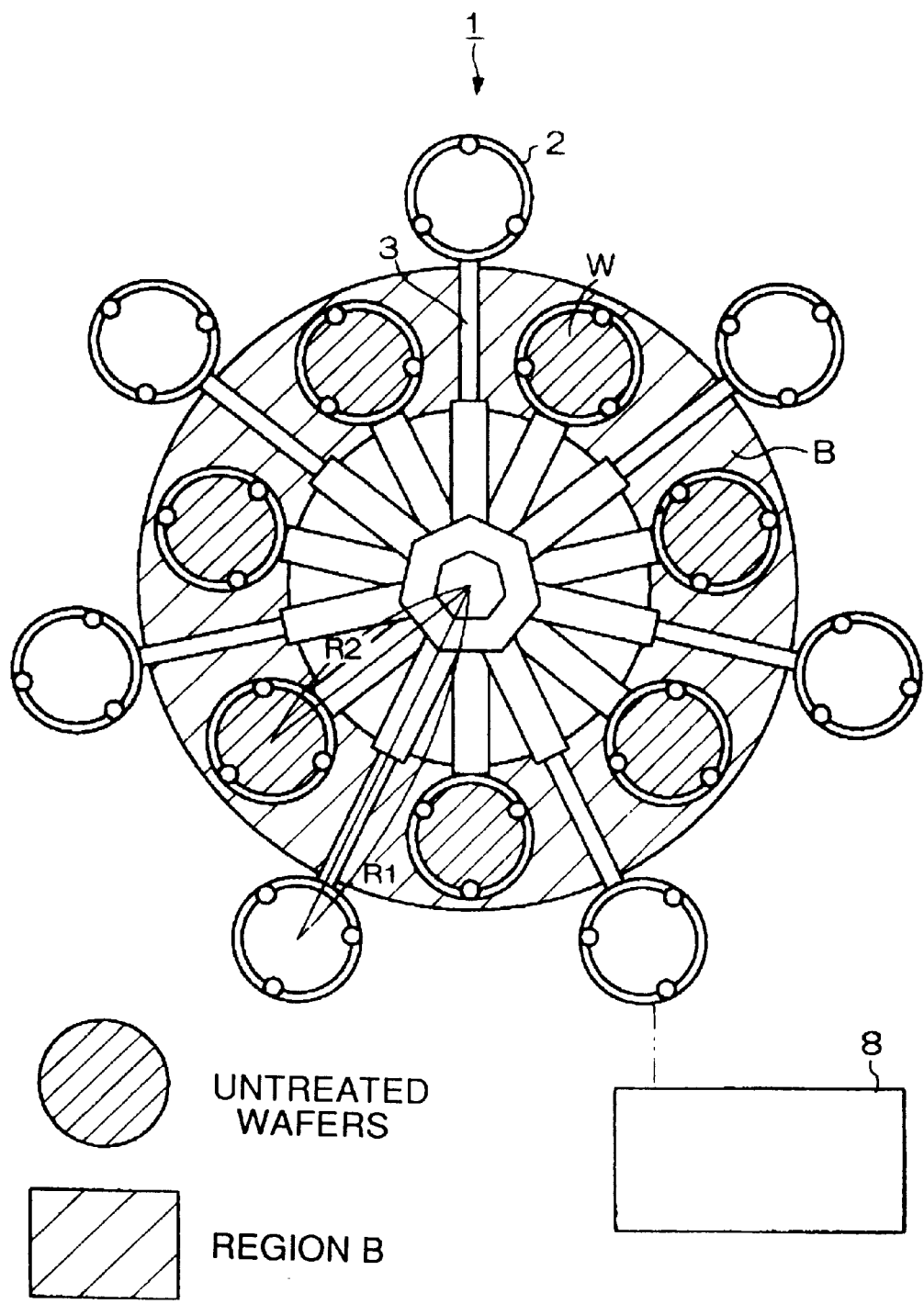
FIG. 6 is a diagram showing when ion implantation is performed on the wafers supported as shown in FIG. 5.

Next, as shown in FIG. 5, the holder arms 3 of the wafer holders 2 supporting untreated wafers W contract towards the center of the wafer disc. At this time, the distance between the center of the wafer support and the center of the wafer disc becomes R2 which is smaller than R1. In this state, the position of the gravity center of the wafer disc 1 is adjusted so as to coincide with the center of the wafer disc 1 by means of the center of gravity adjusting unit 5. When contraction of the holder arms is completed, the moving distance of the disc 1 (scanning width) is changed such that the region of ion irradiation on the disc is altered from the region A shown in FIG. 3 to the region B shown in FIG. 6. The ion implantation is carried out by irradiation of ions on the untreated wafers while rotating and scanning the disc. After completion of the ion implantation, the holder arms extend to the original positions and wafers W are conveyed to the outside of the disc.

(3) The Case When the Ion Dose is the Same for Every Wafer and the Number of Untreated Wafers is More than Half of the Number of Wafer Holders of the Wafer Disc The case will be described in which the ion dose is the same for every wafer and the number of untreated wafers is more than half of the number of wafer holders of the wafer disc, that is, the number of untreated wafers is 8 to 13 with reference to FIGS. 7 and 8.

Figure 7:
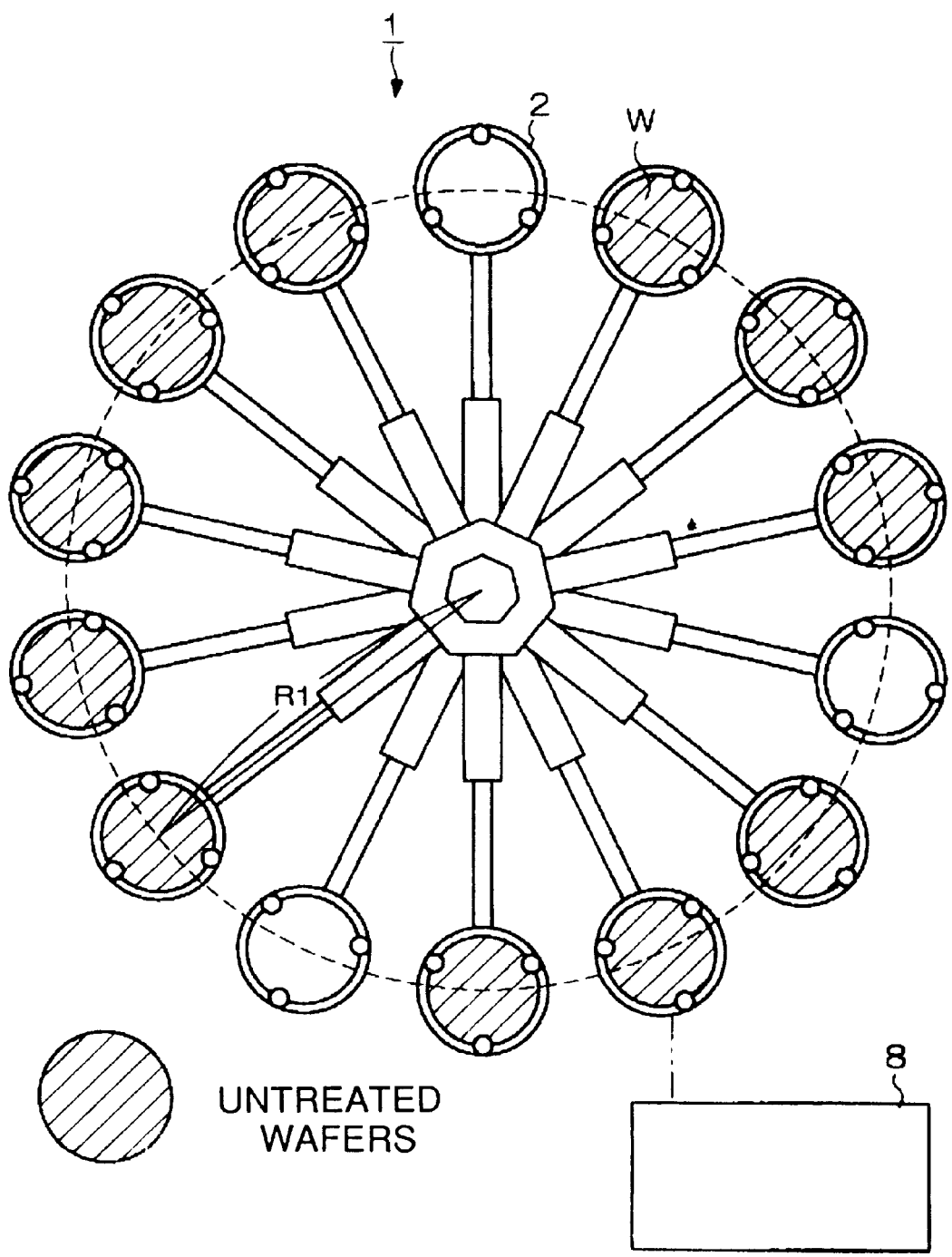
FIG. 7 is a diagram to explain the movements of the wafer disc in the apparatus when the number of untreated wafers is more than half and less than the number of wafer holders.

When the control unit 8 recognizes that the ion dose is the same for every wafer and the number of untreated wafers is more than half (11 wafers, in the figure) of the number of the wafer holders, untreated wafers W are conveyed and installed onto the wafer disc 1 such that the center of gravity of the disc 1 does not differ from the center of the disc, as shown in FIG. 7.

Figure 8:
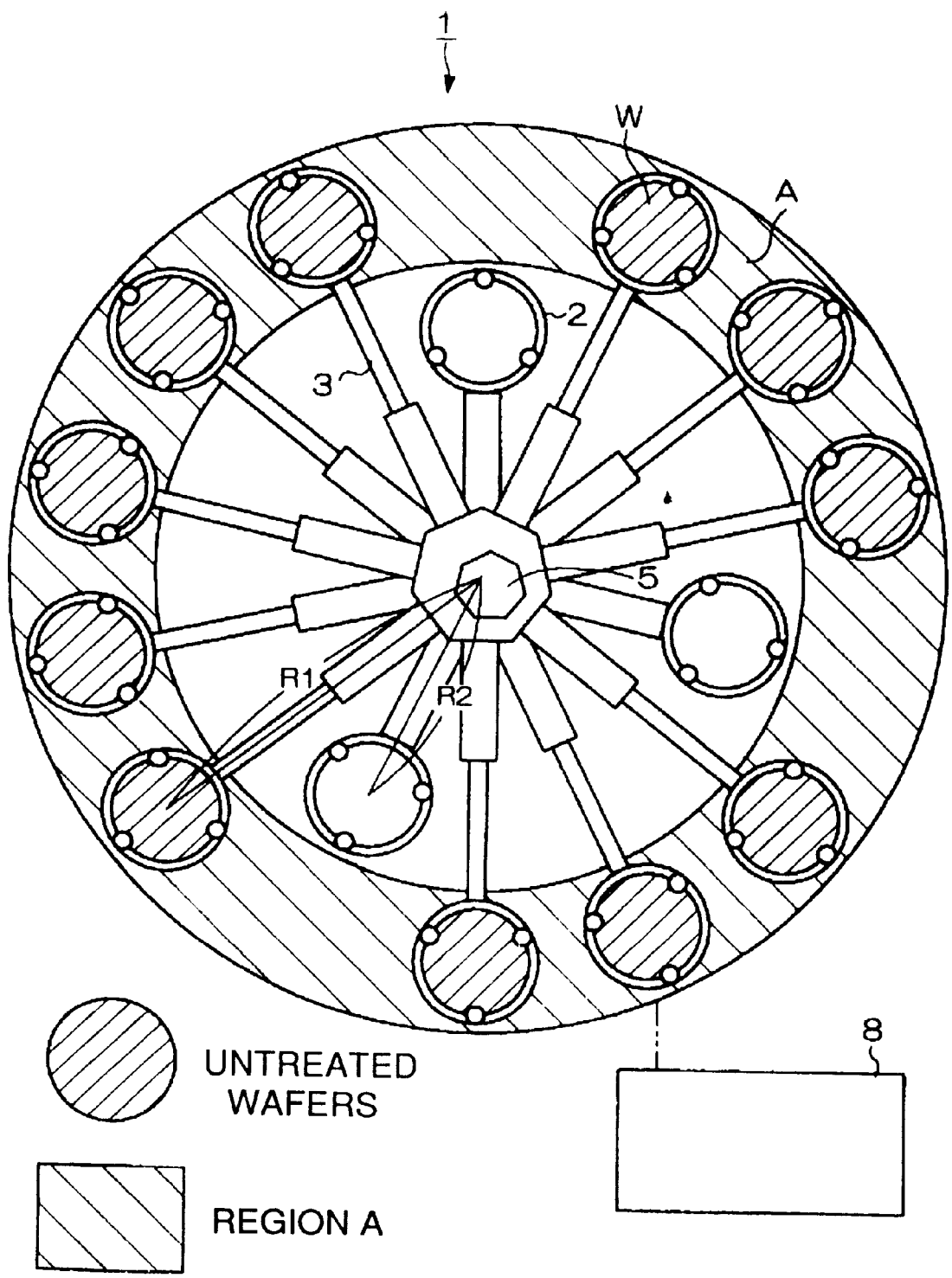
FIG. 8 is a diagram to explain the movements of the wafer disc when the condition of FIG. 7 is applied.

Subsequently, in contrast to FIG. 2, the holder arms 3 of the wafer holders which does not support untreated wafers W contract toward the center of the disc, as shown in FIG. 8. At this time, the distance between the center of the wafer holders 2 and the center of the disc 1 is R1. The gravity center adjusting unit 5 adjusts the center position of the disc 1 so as to coincide with the center of gravity of the disc. The distance of the disc movement (scanning width) is not altered and remains as original. Ion implantation is carried out for the same region A as the case (1).

(4) The Case in Which Two Different Ion Doses are Applied and the Number of Untreated Wafers is Less than the Number of Wafer Holders The case in which two ion implantation conditions (two ion doses) are applied to untreated wafers and in which the total number of untreated wafers is less than the number of wafer holders will be described with reference to FIGS. 9 and 10.

Figure 9:
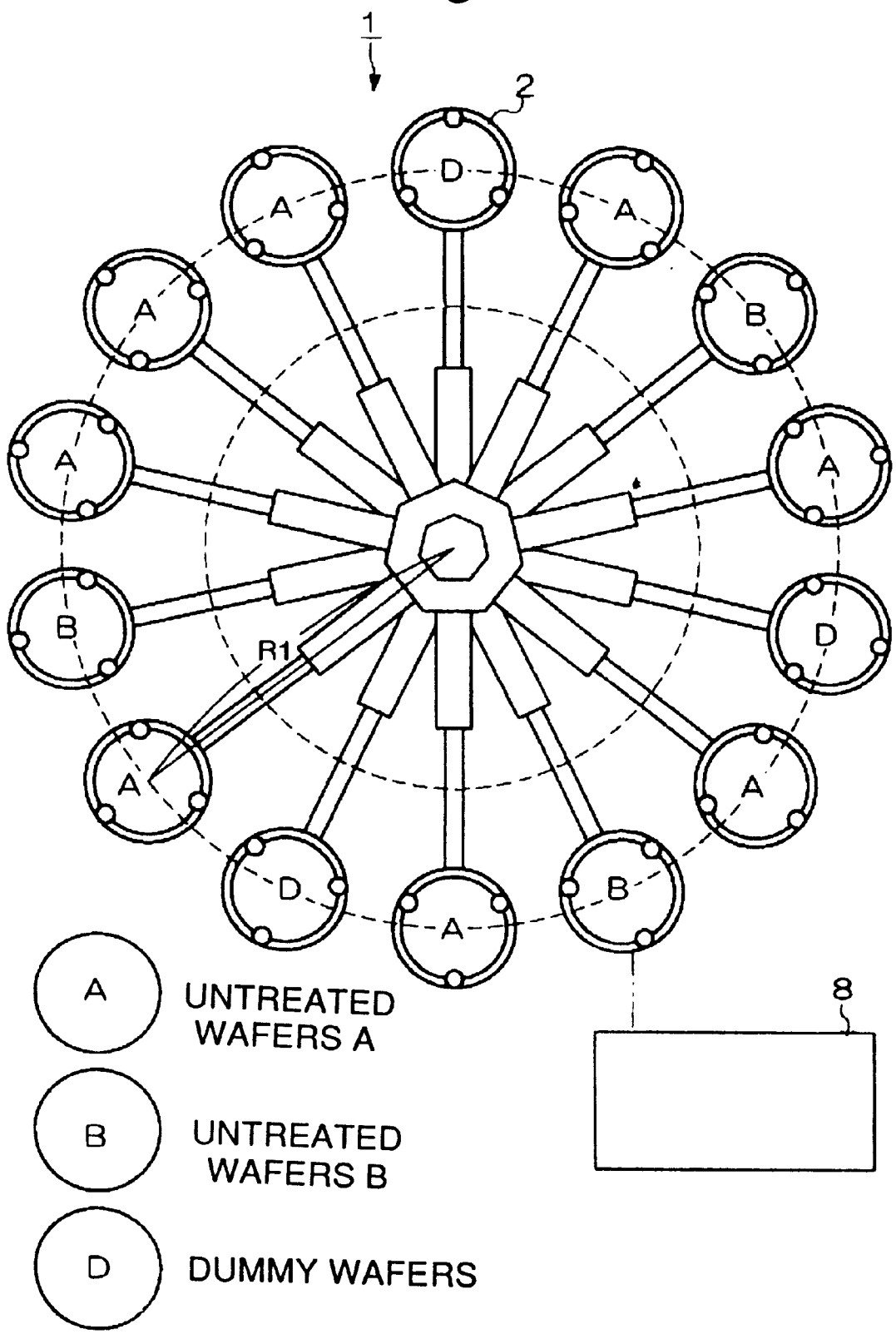
FIG. 9 is a diagram to explain the movements of the wafer disc, when two working conditions are applied to one batch of wafers.
Figure 10:
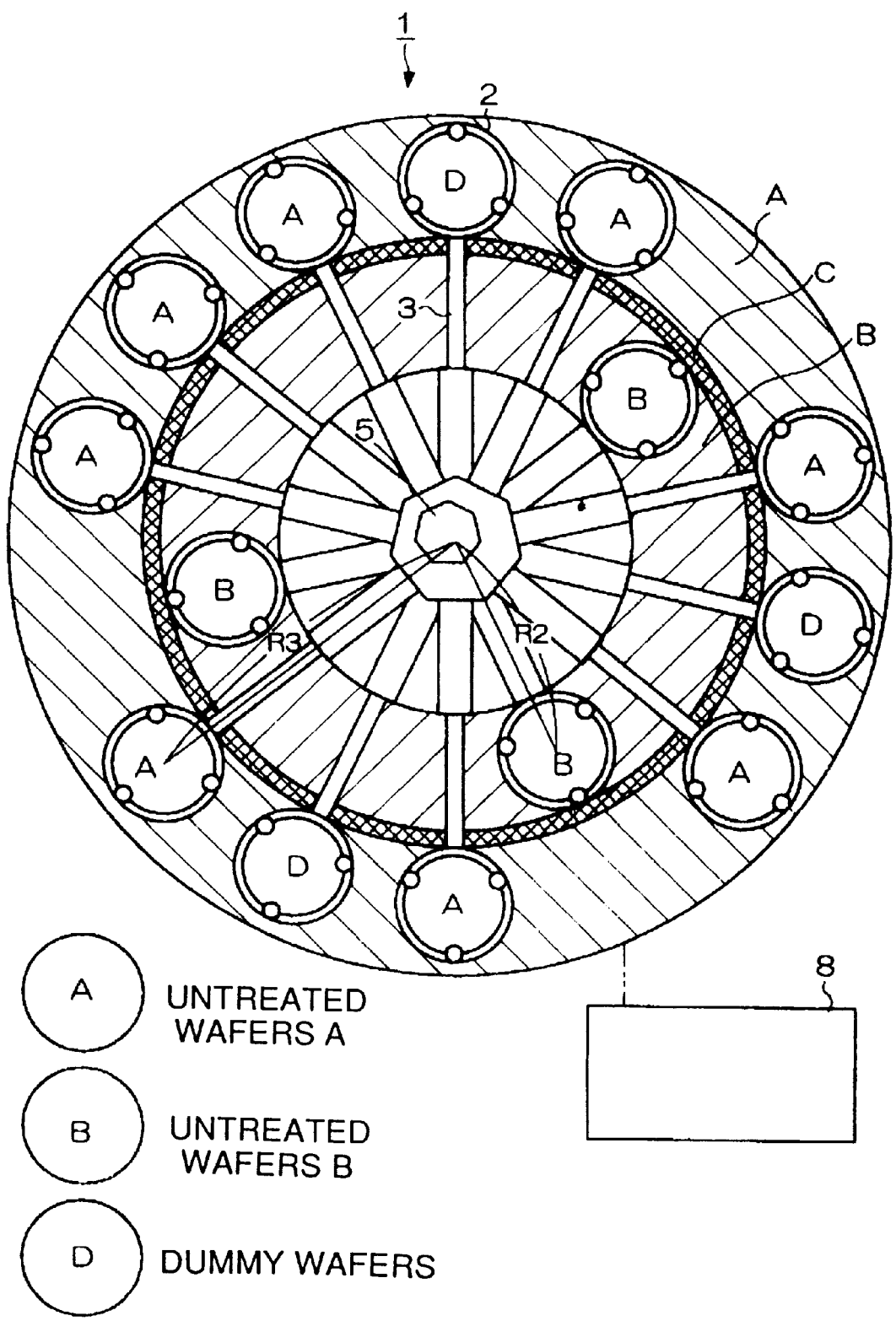
FIG. 10 is a diagram to explain the movements of the wafer disc when the condition of FIG. 9 is applied.

When the control unit 8 judges that two ion implantation conditions are required for wafers in one batch and the number of wafers are less than the number of wafer holders (in the figure, 8 wafers will be treated by the working condition A, and 3 wafers to be treated by the working condition B is 3), the major portion of 8 wafers A are first conveyed to and supported on the disc, as shown in FIG. 9, such that the disc center does not shift from the center of gravity of the disc. The minor portion of 3 wafers are then conveyed to and supported on the wafer holders, such that the disc center does not shift from the gravity center of the disc. In addition, dummy wafers are conveyed to and supported on wafer holders which do not support the untreated wafers (dummy wafers are only used in this case). At this time, the distance between the center of the wafer holders and the disc center is the normal distance of R1.

The holder arms 3 of wafer holders 2 which support untreated wafers B contract towards the disc center, and the distance between the disc center and the center of the wafer holders supporting untreated wafers B becomes R2. In contrast, the holder arms connected to wafer holders supporting untreated wafers A and the dummy wafers extends towards the outside of the disc. At this time, the distance between the center of the wafer holders and the disc center becomes R3 which is longer than the normal distance of R1. At this state, the position of the center of gravity of the disc 1 is adjusted so as to coincide with the disc center by the gravity center adjusting unit 5. Once extension and contraction of the holder arms is completed, then the control unit 8 changes the disc moving distance (scanning width) and changes the ion irradiation region from the A region to the A+B+C regions. Furthermore, the control unit 8 calculates the optimum scanning speed (the moving speed of the disc) of respective regions A and B based on the differences between ion implantation conditions in A and B regions, and then ion implantation is carried out by said optimum scanning speeds using the C region as the changing region of the scanning speeds. If it is not possible to cope with the difference in conditions for ion implantation by only changing the scanning speeds of the respective regions, it is possible to cope with the difference by changing the irradiation time for respective regions by first scanning A+B+C regions, and then scanning the A or B regions individually.

In the ion implantation apparatus according to this embodiment of the present invention, wafer holders supporting untreated wafers W and vacant wafer holders are separated by being in different positions such that the vacant wafer holders are not subjected to ion irradiation. Thus, the present apparatus is not required to use dummy wafers, which are required in conventional ion implantation apparatus. Furthermore, when the number of untreated wafers is not large, it is possible for the present apparatus to execute ion implantation only by irradiating on a small area which is formed by moving wafer holders supporting untreated wafers W towards the center of the disc. In this case, the ratio of the product area to the total ion irradiation area increases, so that the throughput becomes large. Furthermore, because the present ion implantation apparatus is able to cope with the two different ion doses for wafers in one batch in continuous execution of ion implantation, the working efficiency of ion implantation is improved.

It should be noted that the scope of the present invention is not limited to the above described embodiment, and it is possible to modify the present ion implantation apparatus without departing from the subject matters of the present invention. For example, the number of wafer holders on the wafer disc 1 is described as 14 in the above embodiment, but it is possible to modify the number of wafer holders optionally.

Hereinafter, some other examples of holder arms are described. The example of the holder arm shown in FIG. 11 differs from the holder arm shown in FIG. 2 in that the holder arm of FIG. 11 is driven by a motor in contrast to the air cylinder for the holder arm shown in FIG. 2.

The holder arm shown in FIG. 11 comprises a piston rod 26 mounted in a cylinder tube 25, lubricators 27a and 27b, a drive shaft 28, a motor 29, a water cooling piping 30, and a tube for cooling water 31. The motor 29 is rotatable in both directions by means of electric signals. The motor 29 and the drive shaft 28 are connected to each other, and the drive shaft 28 rotates in the same direction as that of the motor. A screw is formed on the drive shaft, and at this part, a protrusion 26a of the piston rod 26 contacts and engages with the screw. When the drive shaft 28 rotates in the forward direction, the piston rod 26, through contact with the screw, moves to expand by moving toward the left side of the figure. In contrast, when the drive shaft 28 rotates in the opposite direction, the piston rod 26 contracts by moving toward the right side of the figure. The piston rod 26 is mounted at the center of the cylinder tube 25 and it is maintained in parallel with the drive shaft 28 by lubricators

27a and 27b. A hole 25a is bored in the cylinder tube 25 and the inside of the cylinder tube 25 reaches a vacuum state similar to the outside vacuum region.

As hereinbefore described, the present ion implantation apparatus has following effects.

The first effect is that, when the ion dose is the same for every wafer in one batch, either one of the wafer holders supporting the wafers or the vacant wafer holders are separated by changing their radial position on the disc, so that the vacant wafer holders will not be subjected to ion implantation, which results in the reduction of dummy wafers and in reduction of the production cost.

The second effect is that, when the same ion dose is implanted for every wafer in the batch, and the number of wafers in the batch is less than half of the number of wafer holders, it is possible to increase the ratio of the product area to the total ion implantation area by moving the wafer holders which support wafers toward the center of the disc, which results in improving the throughput.

The third effect is that, when a plurality of ion doses are applied to wafers in one batch and the number of wafers in the batch is less than the number of wafer holders, it is possible to carry out ion implantation at different ion doses by moving the wafer holders and by changing the scanning speed in response to the difference in ion doses, which results in improving the working efficiency of ion implantation.

What is claimed is:

1. An ion implantation apparatus which is provided with a wafer disc having a plurality of wafer holders to support a plurality of wafers, and which carries out ion implantation for each wafer, while said wafer disc executes rotational and reciprocating movements, said apparatus comprising:

a control means having holder arms capable of expanding and contracting in the radial direction for controlling the wafer holders by reciprocating motions in the radial direction of the wafer disc such that said plurality of wafer supported on said wafer holders are subjected to ion beam irradiation, while said plurality of wafer holders are designed such that they can move in the radial direction of the wafer disc.

2. An ion implantation apparatus according to claim 1, wherein said apparatus further comprises:

holder arms connected to said plurality of wafer holders and which are designed so as to be extendable and contractable in the radial direction of the disc; and a driving means for driving said holder arms to extend or to contract automatically.

3. An ion implantation apparatus according to claim 1, wherein said apparatus further comprises:

a center of gravity adjusting means for adjusting the center of gravity of the disc so as to coincide with the position of the disc center.

4. An ion implantation apparatus according to claim 1, wherein, when said control means judges that a plurality of ion dose types are required for untreated wafers in a batch, and the number of untreated wafers is less than the number of wafer holders, said control means forms a plurality of concentric circular regions corresponding to the number of dose types by shifting the positions of the wafer holders, and ion implantation is executed by changing a speed of the reciprocating motions of the wafer holders using an intermediate region as the transition region of the speed change.

* * * * *